(12) United States Patent
Sakai

(10) Patent No.: US 9,563,728 B2
(45) Date of Patent: Feb. 7, 2017

(54) EQUIVALENT CIRCUIT MODEL, PROGRAM, AND RECORDING MEDIUM

(71) Applicant: MURATA MANUFACTURING CO., LTD., Kyoto (JP)

(72) Inventor: Yasunori Sakai, Kyoto (JP)

(73) Assignee: Murata Manufacturing Co., Ltd., Kyoto-Fu (JP)

(*) Notice: Subject to any disclaimer, the term of this patent is extended or adjusted under 35 U.S.C. 154(b) by 729 days.

(21) Appl. No.: 13/929,541

(22) Filed: Jun. 27, 2013

(65) Prior Publication Data

US 2014/0012559 A1  Jan. 9, 2014

Related U.S. Application Data

(63) Continuation of application No. PCT/JP2011/076117, filed on Nov. 11, 2011.

(30) Foreign Application Priority Data

Dec. 29, 2010  (JP) .................................. 2010-294558

(51) Int. Cl.
G06F 17/50  (2006.01)

(52) U.S. Cl.
CPC .................................. *G06F 17/5036* (2013.01)

(58) Field of Classification Search
CPC .................................................. G06F 17/5036
USPC ............................................. 703/14; 716/51
See application file for complete search history.

(56) References Cited

U.S. PATENT DOCUMENTS

| 7,266,485 B2 | 9/2007 | Maeshima et al. |
| 2005/0267724 A1 | 12/2005 | Niki et al. |
| 2009/0094013 A1* | 4/2009 | Topaloglu ........... G06F 17/5036 703/14 |

FOREIGN PATENT DOCUMENTS

| CN | 1702466 A | 11/2005 |
| JP | 2002-259482 A | 9/2002 |
| JP | 2002-329840 A | 11/2002 |

OTHER PUBLICATIONS

International Search Report; PCT/JP2011/076117; Feb. 14, 2012.
The extended European search report issued by the European Patent Office on Jan. 27, 2016, which corresponds to European Patent Application No. 11853966.7-1954 and is related to U.S. Appl. No. 13/929,541.

(Continued)

*Primary Examiner* — Dwin M Craig
(74) *Attorney, Agent, or Firm* — Studebaker & Brackett PC

(57) ABSTRACT

A system, method and non-transitory computer-readable medium utilize an equivalent circuit model in which electrostatic capacitance changes in response to an arbitrary DC bias voltage applied to a capacitor from the outside. The equivalent circuit model includes a capacitor equivalent circuit section composed of a base circuit and a multistage circuit, a reference current generator section that calculates a reference current, a multiplying factor generator section that calculates a multiplying factor, and a current source current generator section that generates a current of the current source based on the reference current and the multiplying factor. The multiplying factor generator section generates a voltage of an nth-degree polynomial corresponding to the DC bias voltage when applying the DC bias voltage, and defines a current to be generated when the (Continued)

generated voltage is applied to a resistance as the multiplying factor.

3 Claims, 16 Drawing Sheets

(56) References Cited

OTHER PUBLICATIONS

J.D. Prymak; "SPICE Modeling of Capacitors"; 15th Capacitor and Resistor Technology Symposium; CART 95; Mar. 13-16, 1995; pp. 39-46; San Diego, California.

Mikael Andersson; "Equivalent Circuit Models for Discrete Passive Components"; CARTS Europe; Oct. 20-23, 2008; Helsinki, Finland.

M.D. Waugh; "Design solutions for DC bias in multilayer ceramic capacitors"; Electronic Engineering Time Europe; Aug. 2010; pp. 34-36.

Hyeon-Pyo Jeon, et al.; "Non-linear behavior of multilayer ceramic capacitors with a new equivalent circuit under AC-fields"; Journal of Ceramic Processing Research; 2007; pp. 229-232; vol. 8; No. 4.

"Capacitor—from Wikipedia, the free encyclopedia"; Dec. 24, 2010.

J. Prymak, et al.; "Capacitor EDA Models with Compensations for Frequency, Temperature, and DC Bias"; 2010 Capacitor and Resistor Technology Symposium; CARTS Conference; Mar. 2010; pp. 1-13; New Orleans, LA.

\* cited by examiner (a)

(b)

(a)

(b)

(a)

(b)

(a)

(b)

(a)

(b)

(a)

(b)

(c)

(d)

(e)

(f)

(a)

(b)

(c)

(d)

(e)

(f)

(a)

(b)

(c)

(d)

(e)

(f)

EQUIVALENT CIRCUIT MODEL, PROGRAM, AND RECORDING MEDIUM

CROSS REFERENCE TO RELATED APPLICATIONS

The present application is a continuation of International Application No. PCT/JP2011/076117 filed on Nov. 11, 2011, and claims priority to Japanese Patent Application No. 2010-294558 filed on Dec. 29, 2010, the entire contents of each of these applications being incorporated herein by reference in their entirety.

TECHNICAL FIELD

The technical field relates to capacitor equivalent circuit models, programs, and recording media for use in circuit simulators such as a simulation program with integrated circuit emphasis (SPICE) and the like.

BACKGROUND

When designing an electronic circuit, it is typical to use a circuit simulator such as SPICE or the like to reduce trial and error in designing. As recent electronic circuits operate at higher frequency and faster digitization rate, more precise processing is in need for the circuit simulator. In particular, for an electronic circuit with a capacitor, a result predicted by the circuit simulator often largely deviates from an expected result of actual circuit. Thus, higher accuracy is required for the circuit simulator to work with such an electronic circuit.

For example, as a technology that allows performing a highly accurate circuit simulation, Japanese Unexamined Patent Application Publication No. 2002-259482 (patent document 1) discloses an equivalent circuit model derivation method.

In this equivalent circuit model derivation method, given frequency characteristics of a capacitor are entered in the first step. In the second step, an equivalent circuit model representing either an RC circuit and an RL circuit or an RCL circuit is formed using a resistance (R), a capacitor (C), and an inductor (L) that are frequency independent. Subsequently, in the third step, an evaluation function is composed to evaluate the equivalent circuit model formed in the second step. In the fourth step, circuit constants are determined by minimizing the evaluation function composed in the third step.

With such a technology, the equivalent circuit model of either an RC circuit and an RL circuit or an RCL circuit is formed. By increasing the number of devices in the equivalent circuit model, the circuit simulator may be able to simulate accurately from a low frequency (a frequency lower than a self-resonant frequency of a modeling target device) to a high frequency (a frequency higher than the self-resonant frequency of a modeling target device).

SUMMARY

The present disclosure provides a system, method, and non-transitory computer-readable medium for simulating electrical properties of an electronic circuit using an equivalent circuit model in which an electrostatic capacitance changes in response to an arbitrary DC bias voltage applied to a capacitor from the outside.

In one aspect, a system for simulating electrical properties of an electronic circuit, comprising: a processor; and memory communicatively coupled to the processor, wherein the processor is configured to load an equivalent circuit model of the circuit into the memory. The equivalent circuit model includes a capacitor equivalent circuit section, a reference current generator section, a multiplying factor generator section, and a current source current generator section.

The capacitor equivalent circuit section includes a base circuit that is either an RC circuit or an RCL circuit, and a multistage circuit formed by connecting multiple stages of a circuit to the base circuit, wherein the circuit of the multistage circuit is an RC circuit, an RL circuit, or an RCL circuit. Furthermore, a capacitor element of the base circuit is replaced with a current source.

The reference current generator section has a function to calculate a reference current to be generated when an AC voltage to be applied to the capacitor equivalent circuit section is applied to a capacitor with a unit capacitance based on the following equation (1):

$$I1 = Cref \times (d/dt) \times V1 \qquad (1),$$

where I1 is the reference current, Cref is an ideal capacitor with a unit capacitance, d/dt is a differential operator, and V1 is the AC voltage to be applied to the capacitor equivalent circuit section.

The multiplying factor generator section has a function to calculate a multiplying factor including as a variable a DC bias voltage to be applied to the capacitor equivalent circuit section based on the following equation (2):

$$I2 = (a0 + a1 \times V2 + a2 \times V2^2 + a3 \times V2^3 + \ldots + an \times V2^n) \qquad (2),$$

where I2 is the multiplying factor, V2 is the DC bias voltage to be applied to the capacitor equivalent circuit section, and "$a0 + a1 \times V2 + a2 \times V2^2 + a3 \times V2^3 + \ldots + an \times V2^n$" is a nth-degree polynomial derived from correlation between the measured electrostatic capacitance and the DC bias voltage.

The current source current generator section has a function to calculate a current to be generated in the current source based on the following equation (3):

$$I = I2 \times I1 \qquad (3),$$

where I is the current to be generated in the current source.

In another aspect of the present disclosure, a method, implemented by a processor, for simulating electrical properties of an electronic circuit using an equivalent circuit model of the circuit, includes steps of configuring a capacitor equivalent circuit section, enabling a reference current generator section to function, enabling the multiplying factor generator section to function, and enabling the current source current generator section to function.

Configuring a capacitor equivalent circuit section includes configuring a base circuit that is either an RC circuit or an RCL circuit and a multistage circuit formed by connecting multiple stages of a circuit to the base circuit, the circuit of the multistage circuit being an RC circuit, an RL circuit, or an RCL circuit, a capacitor element of the base circuit being replaced with a current source.

Enabling a reference current generator section to function includes the reference current generator section calculating a reference current to be generated when an AC voltage to be applied to the capacitor equivalent circuit section is applied to a capacitor with a unit capacitance, based on a following equation (1), $$I1 = Cref \times (d/dt) \times V1 \qquad (1),$$

where I1 is the reference current, Cref is an ideal capacitor with a unit capacitance, d/dt is a differential operator, and V1 is the AC voltage to be applied to the capacitor equivalent circuit section.

Enabling the multiplying factor generator section to function includes the multiplying factor generator section calculating a multiplying factor including as a variable a DC bias voltage to be applied to the capacitor equivalent circuit section based on a following equation (2), $$I2=(a0+a1\times V2+a2\times V2^2+a3\times V2^3+ \ldots +an\times V2^n) \quad (2),$$

where I2 is the multiplying factor, V2 is the DC bias voltage to be applied to the capacitor equivalent circuit section, and "$a0+a1\times V2+a2\times V2^2+a3\times V2^3+ \ldots +an\times V2^n$" is a nth-degree polynomial derived from correlation between a measured electrostatic capacitance and the DC bias voltage.

Enabling the current source current generator section to function includes the current source current generator section calculating a current to be generated in the current source based on a following equation (3), $$I=I2\times I1 \quad (3)$$

where I is the current to be generated in the current source.

Another aspect of the present disclosure is a non-transitory computer-readable medium configured to store a program including instructions, which when executed by a processor, implement the above method for simulating electrical properties of an electronic circuit using an equivalent circuit model of the circuit.

DETAILED DESCRIPTION

The inventor realized a problem in the foregoing prior art as follows.

The electrostatic capacitance of ceramics capacitor or the like varies depending on a direct current (DC) bias voltage applied from the outside. This change in electrostatic capacitance is typically referred to as a DC bias characteristic, and cannot be ignored when carrying out circuit simulations of ceramics capacitors or the like. However, in the foregoing prior art, the equivalent circuit model to be derived does not take such a DC bias characteristic into consideration. Thus, it is difficult to carry out the accurate circuit simulation for a capacitor such as a ceramics capacitor or the like.

It may be possible to adopt a method of generating a capacitor equivalent circuit model in view of the DC bias characteristic as one of the models to be derived by the foregoing prior art. However, the adoption of such a method leads to another problem such that a large number of capacitor equivalent circuit models has to be generated for respective DC bias voltages to be applied from the outside. Furthermore, even if the large number of capacitor equivalent circuit models were generated for the respective DC bias voltages, the use of such generated models in circuit simulation is not suitable for practical use since a selection of a capacitor equivalent circuit model has to be repeated for each of the DC bias voltages to be used in a circuit for which the equivalent circuit model is used.

Hereinafter, exemplary embodiments of the present disclosure will be described with reference to the drawings.

Figure 1:
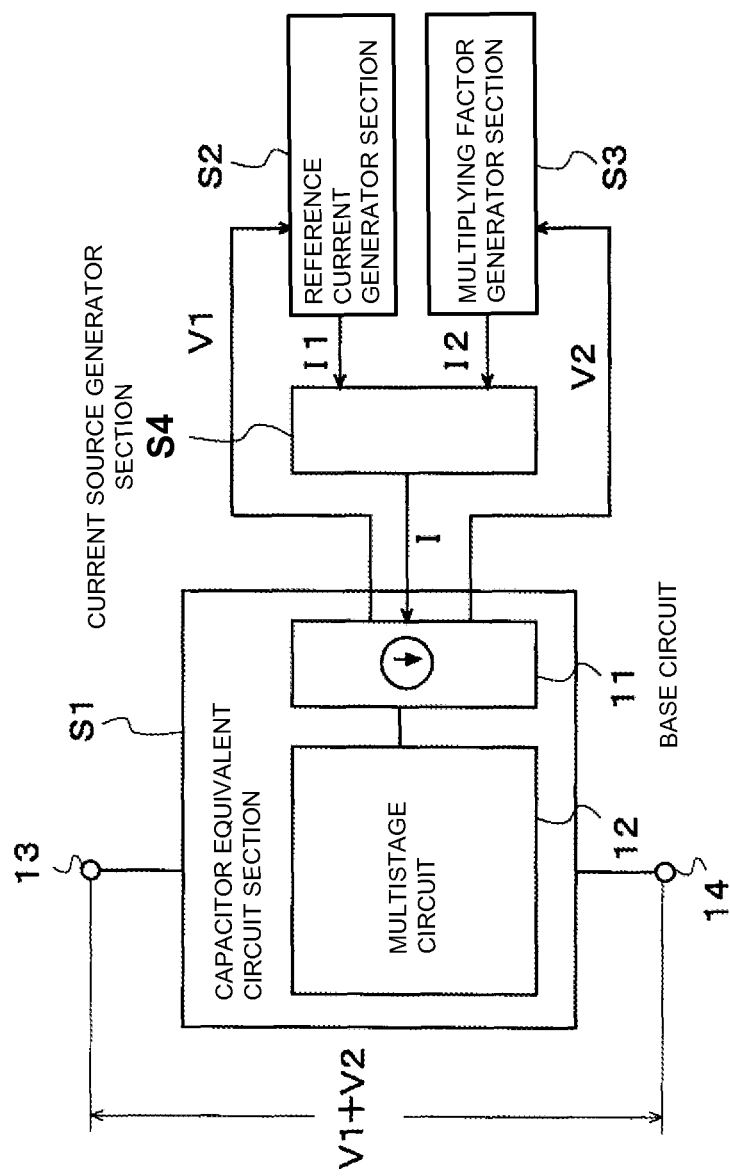
FIG. 1 is a block diagram illustrating an equivalent circuit model according to a first example of the present disclosure.

FIG. 1 is a block diagram illustrating an equivalent circuit model according to the first example of the present disclosure.

As illustrated in FIG. 1, the equivalent circuit model of this example includes a capacitor equivalent circuit section S1, a reference current generator section S2, a multiplying factor generator section S3, and a current source current generator section S4.

Figure 3:
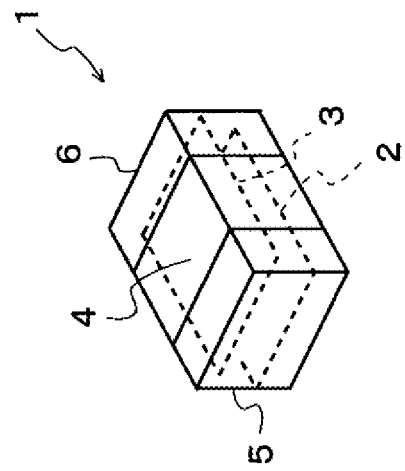
FIG. 3 is a diagram illustrating an external view of a multilayer ceramic capacitor.
Figure 2:
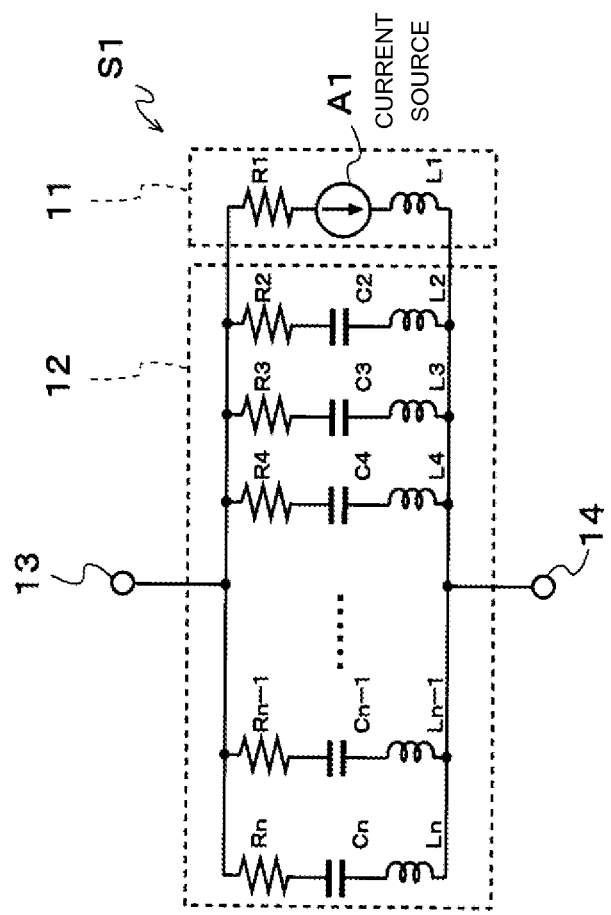
FIG. 2 is a circuit diagram illustrating a capacitor equivalent circuit model.
Figures 4, 5:
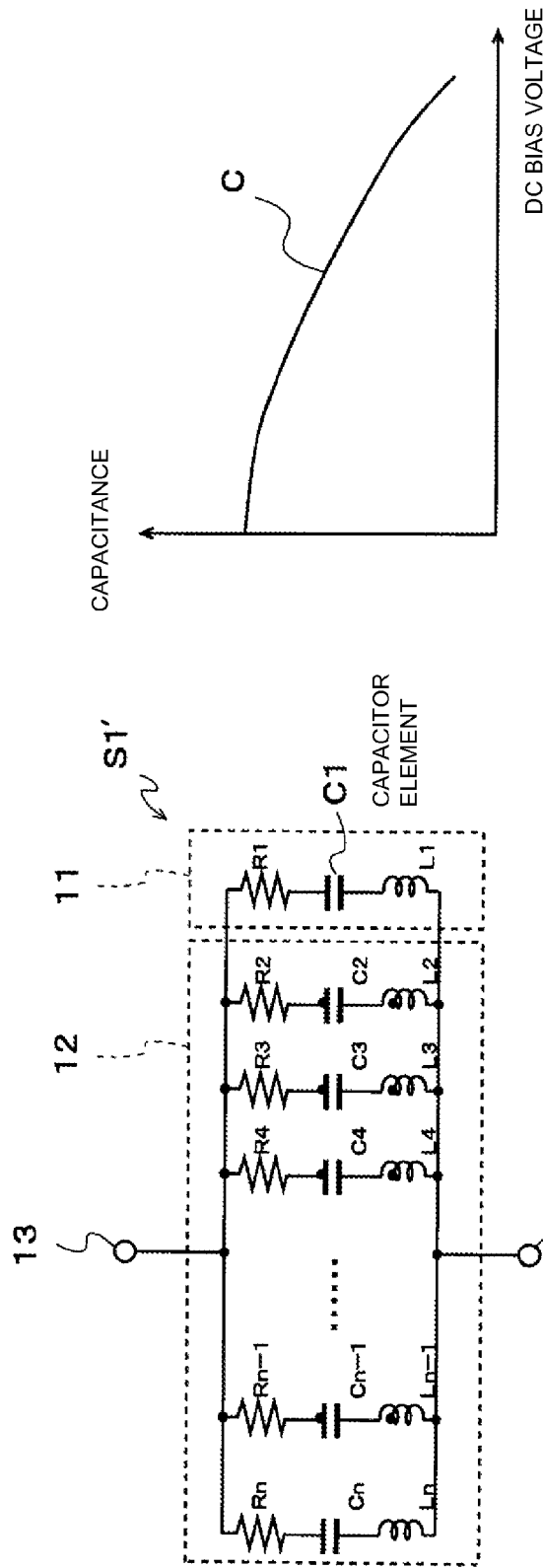
FIG. 4 is a circuit diagram illustrating a capacitor equivalent circuit model prior to replacement of a capacitor element with a current source.
FIG. 5 is a diagram illustrating a DC bias characteristic of an actual multilayer ceramic capacitor.

FIG. 2 is a circuit diagram illustrating a capacitor equivalent circuit model. FIG. 3 is a diagram illustrating an external view of a multilayer ceramic capacitor. FIG. 4 is a circuit diagram illustrating a capacitor equivalent circuit model prior to replacement of a capacitor element with a current source.

As illustrated in FIG. 2, the capacitor equivalent circuit section S1 is composed of a base circuit 11 and a multistage circuit 12. The base circuit 11 is provided with a current source A1.

A method for constructing the capacitor equivalent circuit section S1 is now described in detail.

First, an impedance or equivalent series resistance (ESR) of an actual multilayer ceramic capacitor 1 such as one illustrated in FIG. 3 is measured, and a capacitor equivalent circuit section S1' with frequency response close to that of the measured impedance or ESR is generated.

The bi-terminal multilayer ceramic capacitor 1 has a structure in which, for example, electrodes 2, 3 that face each other are arranged inside a ceramic 4, and the electrodes 2, 3 are respectively connected to outer electrodes 5, 6 that are attached on outer distal ends of the ceramic 4. Thus, it is apparent that the multilayer ceramic capacitor 1 has a capacitor (C) component, an inductor (L) component, and a resistance (R). With these components, the capacitor equivalent circuit section S1' is conceived and constructed.

The capacitor equivalent circuit section S1' thus conceived and constructed from actual measurement as described above is composed of the base circuit 11 and the multistage circuit 12 as illustrated in FIG. 4.

In the present example, the base circuit 11 is composed of an RCL circuit in which a R1 element, a C1 element, and a L1 element are connected in series. Furthermore, the multistage circuit 12 is configured by connecting multiple stages of an RCL circuit in parallel to the base circuit 11, and this RCL circuit is the same RCL circuit as that of the base circuit 11.

In FIG. 1 and FIG. 4, reference numerals 13, 14 indicate input and output terminals that correspond to the outer electrodes 5, 6 of the multilayer ceramic capacitor 1.

As illustrated in FIG. 2, the capacitor equivalent circuit section S1 is constructed by replacing the C1 element, which is the capacitor element of the base circuit 11 in the capacitor equivalent circuit section S1' generated as described above, with the current source A1.

In other words, the electrostatic capacitance of the multilayer ceramic capacitor 1 changes in response to a change in DC bias voltage to be applied. Accordingly, by associating the change in electrostatic capacitance with the change in current, it becomes possible to simulate the electrostatic capacitance change of the capacitor equivalent circuit section S1 with the change in current I that flows through the current source A1.

In FIG. 1, the reference current generator section S2 is a functional section for calculating a reference current I1 and outputting this reference current I1 to the current source current generator section S4.

More specifically, the reference current I1 to be generated is calculated when an AC voltage V1 is applied to a capacitor with a unit capacitance. Here, the AC voltage V1 is a voltage to be applied to a portion of the current source A1 through the input and output terminals 13, 14. In this case, the reference current I1 is derived by calculating the following equation (1):

$$I1 = C_{ref} \times (d/dt) \times V1 \quad (1)$$

where Cref is an ideal capacitor with a unit capacitance, namely, a capacitor with a fixed capacitance that does not change in response to the DC bias voltage, and d/dt is a differential operator.

The multiplying factor generator section S3 is a functional section for calculating a multiplying factor I2 and outputting this multiplying factor I2 to the current source current generator section S4.

In this multiplying factor generator section S3, the multiplying factor I2 including the DC bias voltage as a variable is derived by calculating the following equation (2). More specifically, the multiplying factor I2 including the DC bias voltage as a variable is represented by the following nth-degree polynomial when the DC bias voltage is applied to the portion of the current source A1 through the input and output terminals 13, 14.

$$I2 = (a0 + a1 \times V2 + a2 \times V2^2 + a3 \times V2^3 + \ldots + an \times V2^n) \quad (2)$$

This polynomial "a0+a1×V2+a2×V2²+a3×V2³+ . . . +an×V2ⁿ" is an nth-degree polynomial derived from the correlation between the measured electrostatic capacitance and the DC bias voltage, and may be obtained as follows.

FIG. 5 is a diagram illustrating the DC bias characteristic of an actual multilayer ceramic capacitor.

For example, as illustrated in FIG. 5, a characteristic curve C, along which the electrostatic capacitance decreases as the DC bias voltage increases, may be obtained when the relationship between the electrostatic capacitance of the actual multilayer ceramic capacitor and the DC bias voltage is measured.

Thus, coefficients "a0" to "an" of the polynomial may be determined so as to approximate such a characteristic curve C. This allows obtaining the foregoing equation (2) that is an nth-degree polynomial with one variable and includes the DC bias voltage as this variable.

As illustrated in FIG. 1, the current source current generator section S4 is a functional section that generates a current I of the current source A1 based on the reference current I1 and the multiplying factor I2 inputted from the reference current generator section S2 and the multiplying factor generator section S3.

More specifically, the current source current generator section S4 calculates the current I based on the following equation (3):

$$I = I2 \times I1 \quad (3)$$

In this way, the electrostatic capacitance of the capacitor equivalent circuit section S1 may be derived by calculating the current I of the current source A1 that corresponds to the change in DC bias voltage.

Next, functions and effects of the equivalent circuit model of the present example are described.

First, in FIG. 1, when the AC voltage V1 and the DC bias voltage V2 are superimposed and applied across the input and output terminals 13, 14 of the capacitor equivalent circuit section S1, the reference current generator section S2 refers to the AC voltage V1 to be applied to the portion of the current source A1 and calculates the reference current I1 that would be generated when the AC voltage V1 is applied to a capacitor with a unit capacitance based on the foregoing equation (1). Furthermore, the multiplying factor generator section S3 refers to the DC bias voltage V2 to be applied to the current source A1 and calculates the multiplying factor I2 based on the foregoing equation (2).

Accordingly, the current source current generator section S4 calculates the current I of the current source A1 based on the reference current I1 and the multiplying factor I2 inputted from the reference current generator section S2 and the multiplying factor generator section S3.

Here, from the foregoing equations (1) and (2), the foregoing equation (3) is rewritten as the following equation (4):

$$\begin{aligned} I &= I2 \times I1 \\ &= (a0 + a1 \times V2 + a2 \times V2^2 + a3 \times V2^3 + \ldots + an \times V2^n) \times \\ &\quad C_{ref} \times \left(\frac{d}{dt}\right) \times V1 \\ &= F(V2, V1) \end{aligned} \quad (4)$$

In other words, the current I to be generated in the current source A1 is a function of the DC bias voltage V2 and the AC voltage V1, and changes in response to these voltages V1, V2.

Accordingly, by making the connection between the current I calculated by the current source current generator section S4 and the electrostatic capacitance, it becomes possible to obtain the electrostatic capacitance of the equivalent circuit model that changes in response to the AC voltage V1 and the DC bias voltage V2.

Figure 6:
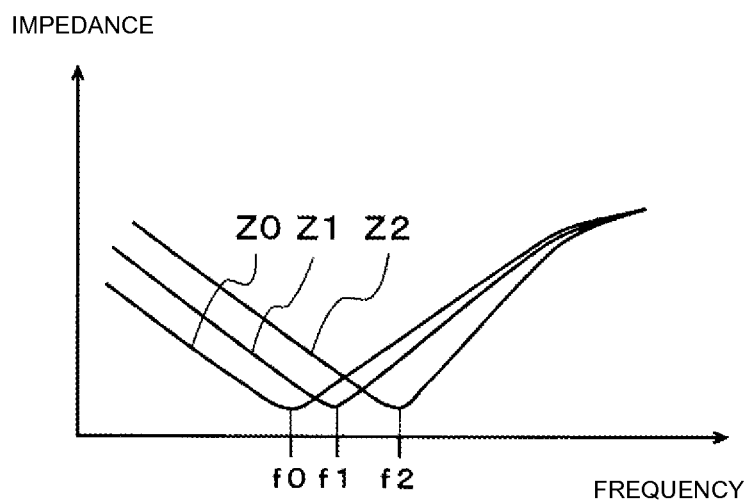
FIG. 6 is an impedance-frequency correlation diagram to describe a self-resonant frequency that changes in response to a DC bias voltage.

FIG. 6 is an impedance-frequency correlation diagram to describe a self-resonant frequency that changes in response to the DC bias voltage.

In the actual multilayer ceramic capacitor 1 as illustrated in FIG. 3, the electrostatic capacitance decreases as the DC bias voltage increases. Thus, the self-resonant frequency of the multilayer ceramic capacitor 1 increases as the DC bias voltage increases.

In other words, as illustrated in FIG. 6, when f0 is the self-resonant frequency in the case where the DC bias voltage is zero and the f0 is the lowest self-resonant frequency as illustrated with an impedance curve Z0, the self-resonant frequency increases to f1 and f2 as the DC bias voltage increases, as illustrated with impedance curves Z1 and Z2. Accordingly, it becomes possible to obtain impedance curves substantially the same as the impedance curves Z0, Z1, and Z2 illustrated in FIG. 6 by making the connection between the current I that changes in response to the DC bias voltage V2 and the electrostatic capacitance of the capacitor equivalent circuit section S1 such as the equivalent circuit model of the present example, or more specifically, the electrostatic capacitance represented by the current source A1 of the base circuit 11.

Figure 7:
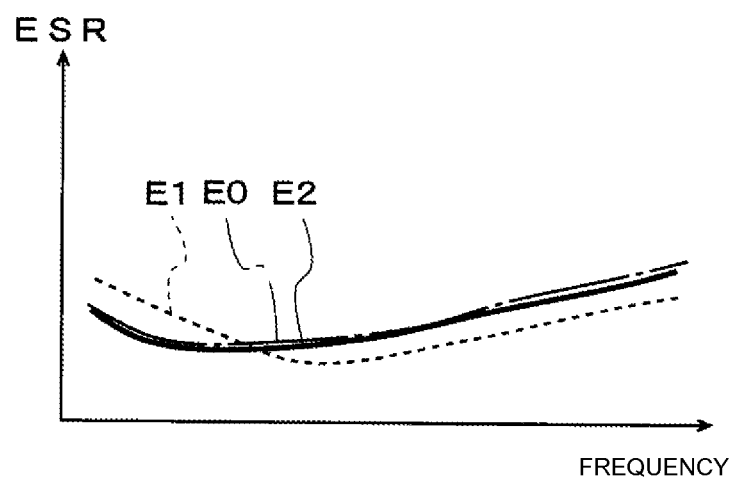
FIG. 7 is an ESR-frequency correlation diagram to describe ESR that varies depending on a multistage circuit.

FIG. 7 is an ESR-frequency correlation diagram to describe ESR that varies depending on the multistage circuit 12.

When an ESR curve E0 of FIG. 7 is a measured ESR characteristic of the multilayer ceramic capacitor 1, it is preferable that ESR of the capacitor equivalent circuit section S1 coincides with this ESR curve E0.

However, in the configuration of the multistage circuit 12 illustrated in FIG. 2, the ESR characteristic sometime deviates from the ESR curve E0 as illustrated with an ESR curve E1. In such a case, as illustrated with an ESR curve E2, it is possible to match the ESR characteristic closely with the ESR curve E0 by changing the configuration of the multistage circuit 12 by use of the RC circuit, the RL circuit, or the RCL circuit.

As described above, the equivalent circuit model of the present example allows the electrostatic capacitance to change in response to the change in DC bias voltage in a manner close to that of actual measurement. Frequency characteristic analysis of such an equivalent circuit model may be performed by using a circuit simulator such as SPICE or the like.

Furthermore, all the functions of the capacitor equivalent circuit section S1 to the current source current generator section S4 of the equivalent circuit model may be programmed in various programming languages, and resultant programs may be stored and retained in recording media.

Next, the second example of the present disclosure will be described.

Figure 8:
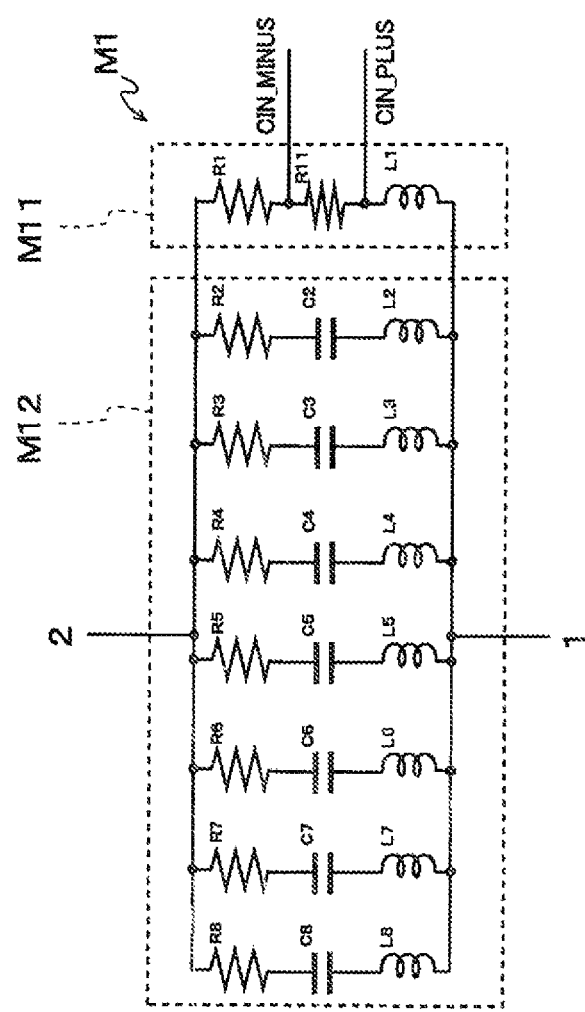
FIG. 8 is a SPICE model diagram of a capacitor equivalent circuit to be applied to an equivalent circuit model according to a second example of the present disclosure.
Figure 9:
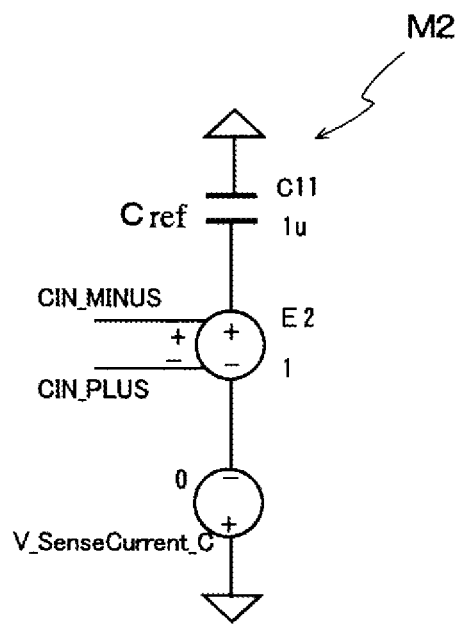
FIG. 9 is a SPICE model diagram representing a reference current generator section.
Figure 10:
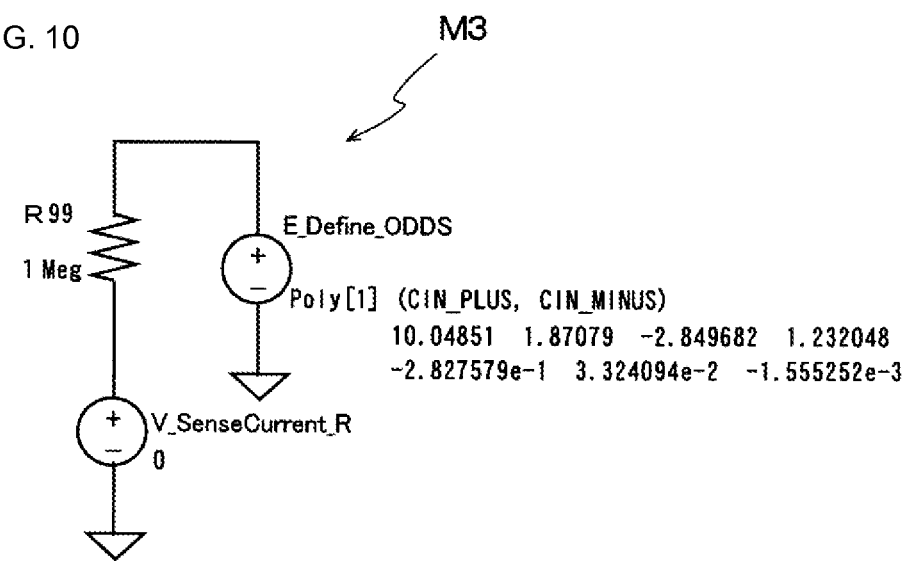
FIG. 10 is a SPICE model diagram representing a multiplying factor generator section.
Figure 11:
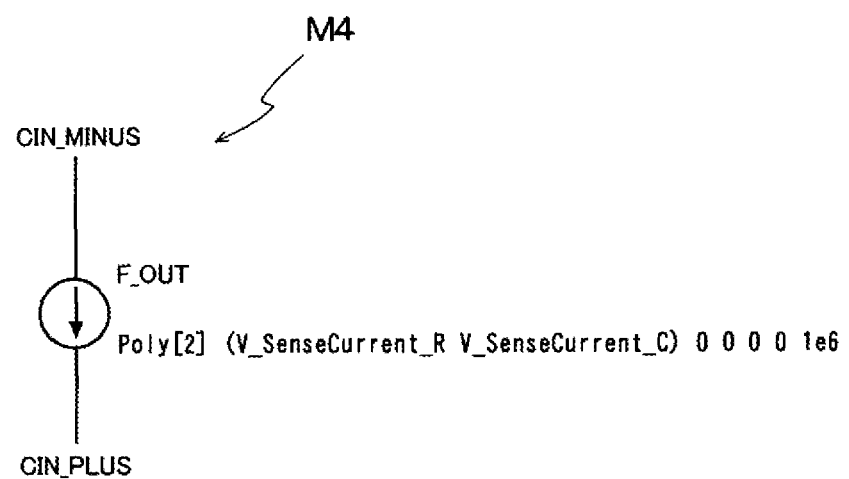
FIG. 11 is a SPICE model diagram representing a current source current generator section.

FIG. 8 is a SPICE model diagram of the capacitor equivalent circuit section S1 to be applied to an equivalent circuit model according to the second example of the present disclosure. FIG. 9 is a SPICE model diagram representing the reference current generator section S2. FIG. 10 is a SPICE model diagram representing the multiplying factor generator section S3. FIG. 11 is a SPICE model diagram representing the current source current generator section S4.

In the present example, examples of an equivalent circuit model utilizing SPICE that serves as a circuit simulator are illustrated.

As illustrated in FIG. 8 to FIG. 11, this equivalent circuit model includes four SPICE models M1, M2, M3, and M4.

In the present example, for ease of understanding, the SPICE models are described for an equivalent circuit model of an actual product of multilayer ceramic capacitor with a size of 2.0 mm×1.25 mm and a DC bias characteristic in which the electrostatic capacitance is 22 µF at 6.3 V.

The SPICE model M1 is a model implemented by SPICE for the capacitor equivalent circuit section S1 of the foregoing first example and includes, as illustrated in FIG. 8, a SPICE model M11 corresponding to the base circuit 11 and a SPICE model M12 corresponding to the multistage circuit 12.

In the SPICE model M1, reference symbols in the upper right of respective components are component names determined by the user, and reference symbols in the lower right indicate component functions.

In the SPICE model M11, an insulation resistance R11 of the capacitor is arranged between the resistance R1 and the inductor L1. Furthermore, both ends of the insulation resistance R11 are defined as nodes CIN_MINUS and CIN_PLUS.

The SPICE model M12 is configured in such a way that seven stages of a series circuit composed of a resistance element, a capacitor element, and an inductor element are connected in parallel.

Functions of elements in these SPICE models M11, M12 are set so as to have characteristics corresponding to the measured frequency characteristics of the foregoing actual product of multilayer ceramic capacitor. In the present example, functions of the resistances R1, R11, R2, R3, R4, R5, R6, R7, and R8 are set to 2.90e-3(Ω), 2.30e6(Ω), 0.35e-1(Ω), 0.50e+0(Ω), 4.01e+0(Ω), 2.19e+1(Ω), 3.00e+1 (Ω), 3.30e+1(Ω), and 1.56e+2(Ω), respectively. Functions of the capacitors C2, C3, C4, C5, C6, C7, and C8 are set to 1.20e-6(F), 0.35e-7(F), 0.07e-7(F), 0.74e-6(F), 0.30e-6(F), 0.14e-6(F), and 2.70e-6(F), respectively. Functions of the inductors L1, L2, L3, L4, L5, L6, L7, and L8 are set to 0.66e-9(H), 1.30e-9(H), 3.10e-9(H), 4.00e-9(H), 1.50e-8 (H), 2.00e-9(H), 4.00e-9(H), and 1.50e-8(H), respectively. Here, "e" is "10". Thus, for example, "e-3" means ten to the power of "−3", and "e6" means ten to the power of "6".

The SPICE model M2 is a model implemented by SPICE for the reference current generator section S2.

As illustrated in FIG. 9, the SPICE model M2 is configured in such a way that a voltage-controlled voltage source E2, a capacitor C11 that is an ideal capacitor Cref with a unit capacitance one end of which is grounded, and a dummy voltage source V_SenseCurrent_C are connected in series.

In other words, the voltage-controlled voltage source E2 refers to the nodes CIN_MINUS and CIN_PLUS of the SPICE model M1, amplifies the AC voltage V1 between the nodes CIN_MINUS and CIN_PLUS by a factor of "1", and applies a resultant voltage to the capacitor C11 with a "1 µF" capacitance. This allows the dummy voltage source V_SenseCurrent_C to monitor the reference current I1 thus generated.

The SPICE model M3 is a model implemented by SPICE for the multiplying factor generator section S3.

As illustrated in FIG. 10, the SPICE model M3 is configured in such a way that a voltage-controlled voltage source E_Define_ODDS one end of which is grounded, a 1 MΩ resistance R99, and a dummy voltage source V_Sense-Current_R that is grounded are connected in series.

In other words, the voltage-controlled voltage source E_Define_ODDS refers to the nodes CIN_MINUS and CIN_PLUS of the SPICE model M1, generates the polynomial "$(a0+a1 \times V2+a2 \times V2^2+a3 \times V2^3+ \ldots +an \times V2^n)$" of the foregoing equation (2) with the DC bias voltage V2 between the nodes CIN_MINUS and CIN_PLUS, and applies a resultant voltage to the resistance R99. This allows the dummy voltage source V_SenseCurrent_R to monitor the multiplying factor I2 thus generated.

Here, the foregoing polynomial is a sixth-degree polynomial with one variable V2 that is obtained by fitting this polynomial to the DC bias characteristic of the actual product of multilayer ceramic capacitor, and is represented as a POLY[1] function where coefficients a0, a1, a2, a3, a4, a5, and a6 are 10.04851, 1.87079, −2.849682, 1.232048, −2.827579e-1, 3.324094e-2, and −1.555252e-3, respectively.

This POLY[1] is represented as the voltage applied to the resistance R99. Thus, the foregoing equation (2) is modified as the following equation (5).

$$I2=(a0+a1 \times V2+a2 \times V2^2+a3 \times V2^3+ \ldots +an \times V2^n)/R99 \qquad (5)$$

The SPICE model M4 is a model implemented by SPICE for the current source current generator section S4.

As illustrated in FIG. 11, the SPICE model M4 is composed of a current-controlled current source F_OUT.

The current-controlled current source F_OUT has a function to generate the current I that flows between the nodes CIN_MINUS and CIN_PLUS.

More specifically, the current-controlled current source F_OUT refers to the nodes V_SenseCurrent_R and V_SenseCurrent_C of the dummy voltage sources of the SPICE models M2, M3, and estimates the reference current I1 monitored in those nodes, the multiplying factor I2 indicated by the foregoing equation (5), and the resistance R99. The result is a POLY[2] function that is a sixth-degree polynomial with two variables V1, V2 as illustrated in the foregoing equation (4).

According to the above configuration, a frequency characteristic may be obtained by allowing the current I generated in the SPICE model M4 to flow between the nodes CIN_MINUS and CIN_PLUS of the SPICE model M1. This frequency characteristic is highly accurate from the low frequency to the high frequency, and also takes the DC bias characteristic of capacitor into account.

The frequency characteristic of multilayer ceramic capacitor that is actually measured, the frequency characteristic of the equivalent circuit model of the present example, and the frequency characteristic of an equivalent circuit model in which no DC bias voltage is taken into account are compared by the inventor.

In actual measurement, an AC voltage with a frequency of 100 KHz to 8.5 GHz is applied to an actual product of multilayer ceramic capacitor with a size of "2012" and a DC bias characteristic in which the electrostatic capacitance is 22 μF at 6.3 V, and the impedance and ESR during the application of the AC voltage are measured with a network analyzer or the like.

With regard to the equivalent circuit model of the present example (hereinafter, referred to as "equivalent circuit model 100"), simulations are performed to obtain the impedance and ESR during the period where an AC voltage with a frequency of 100 KHz to 8.5 GHz is being applied across nodes "1" and "2" of the SPICE model M1 illustrated in FIG. 8.

The equivalent circuit model in which no bias voltage is taken into account (hereinafter, referred to as "equivalent circuit model 200") is a model in which the insulation resistance R11 of the SPICE model M11 illustrated in FIG. 8 is replaced with a C1 element with a fixed electrostatic capacitance of 10 μF. Similarly, as is the case with the previous model, simulations are performed to obtain the impedance and ESR during the period where an AC voltage with a frequency of 100 KHz to 8.5 GHz is being applied across the nodes "1" and "2".

Figure 12:
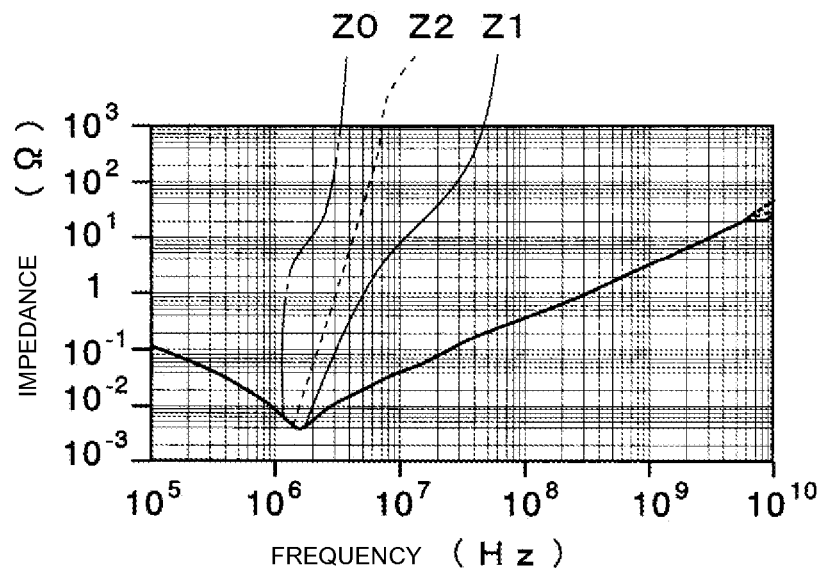
FIGS. 12(a) and 12(b) are diagrams illustrating measurement results where no DC bias voltage is superimposed.
Figure 12:
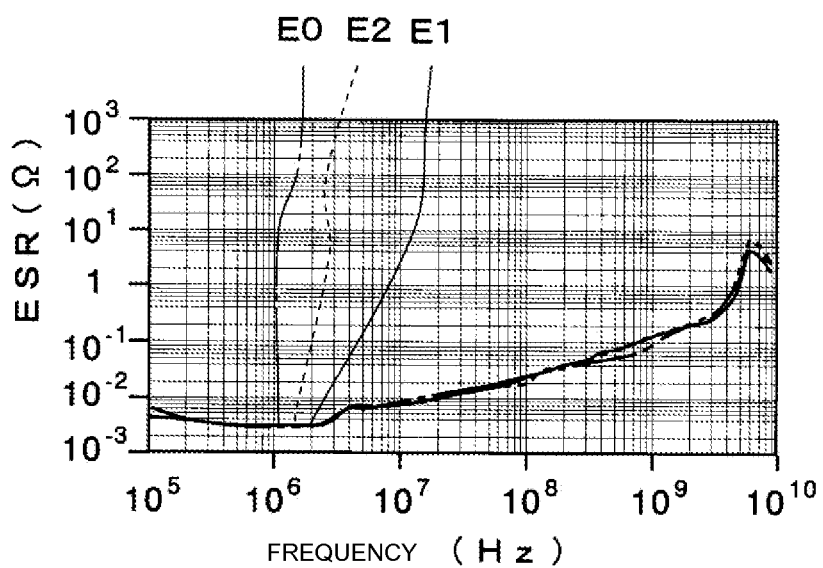

FIGS. 12(a) and 12(b) are diagrams illustrating measurement results where no DC bias voltage is superimposed.

First, the measurement is performed without any superimposed DC bias voltage on the AC voltage. As illustrated in FIG. 12(a), an impedance curve Z0 of the actual product illustrated with a dashed-dotted line, an impedance curve Z1 of the equivalent circuit model 100 illustrated with a solid line, and an impedance curve Z2 of the equivalent circuit model 200 illustrated with a dashed line coincide with each other. Furthermore, as illustrated in FIG. 12(b), an ESR curve E0 of the actual product illustrated with a dashed-dotted line, an ESR curve E1 of the equivalent circuit model 100 illustrated with a solid line, and an ESR curve E2 of the equivalent circuit model 200 illustrated with a dashed line also coincide with each other. In other words, it is confirmed that both the equivalent circuit models 100, 200 coincide with the frequency characteristic of the actual product when no DC bias voltage is applied.

Next, the measurements are performed with different superimposed DC bias voltages on the AC voltage.

Figure 13:
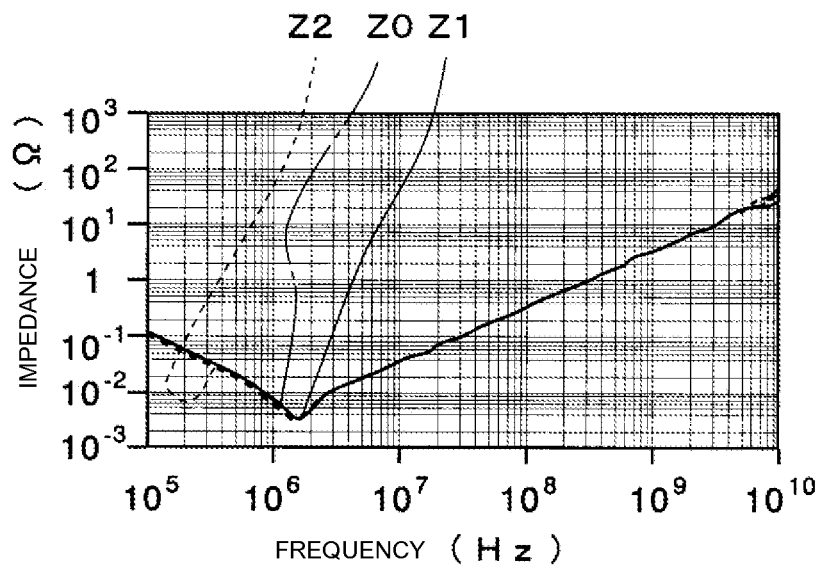
FIGS. 13(a) and 13(b) are diagrams illustrating measurement results where a DC bias voltage of 1.2 V is superimposed.
Figure 13:
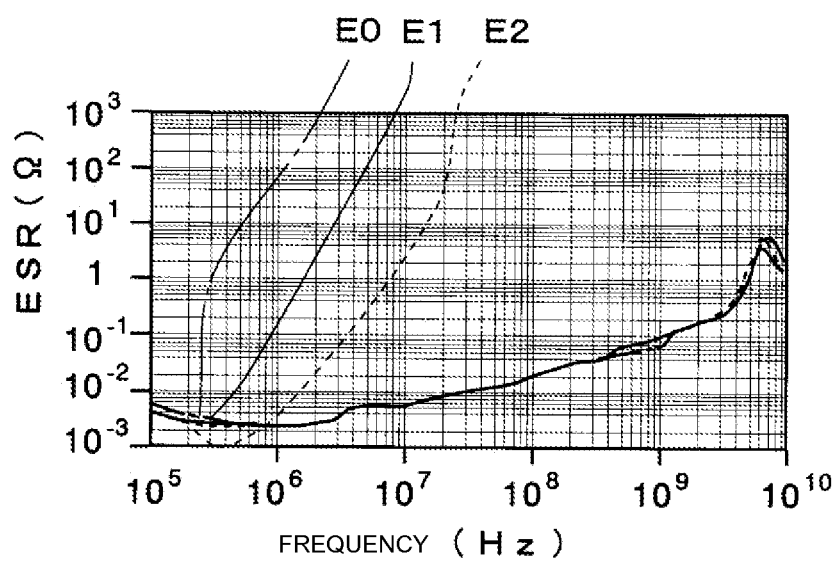
Figure 14:
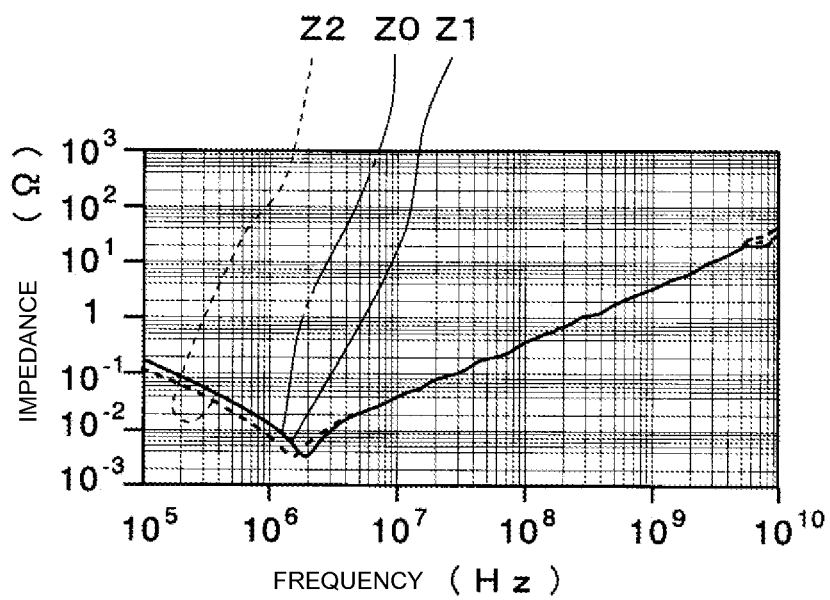
FIGS. 14(a) and 14(b) are diagrams illustrating measurement results where a DC bias voltage of 3.15 V is superimposed.
Figure 14:
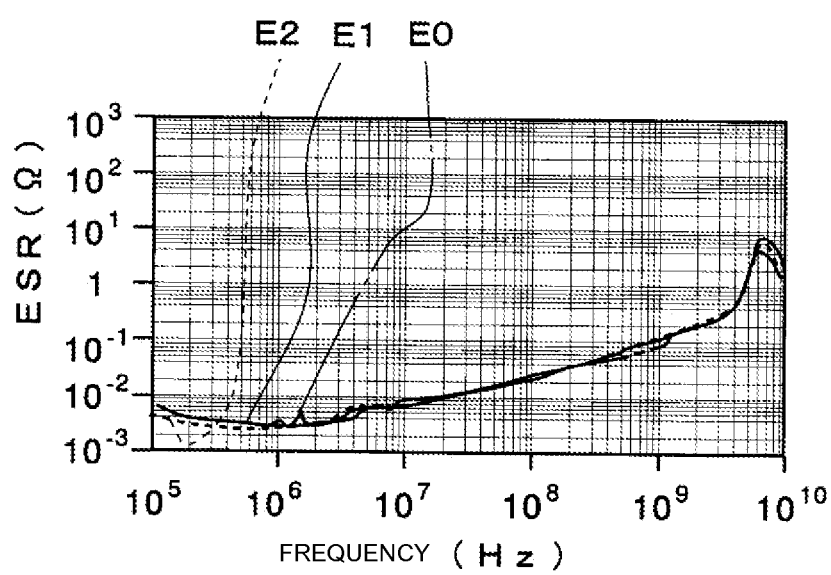
Figure 15:
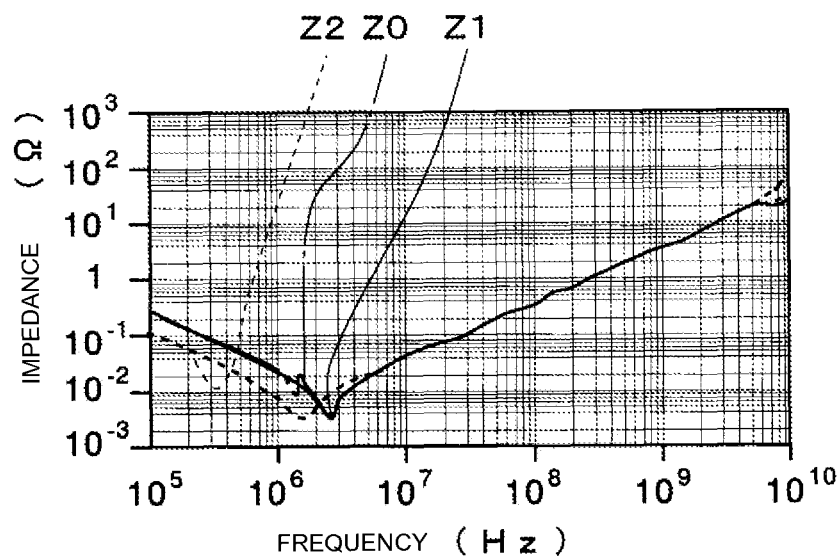
FIGS. 15(a) and 15(b) are diagrams illustrating measurement results where a DC bias voltage of 6.3 V is superimposed.
Figure 15:
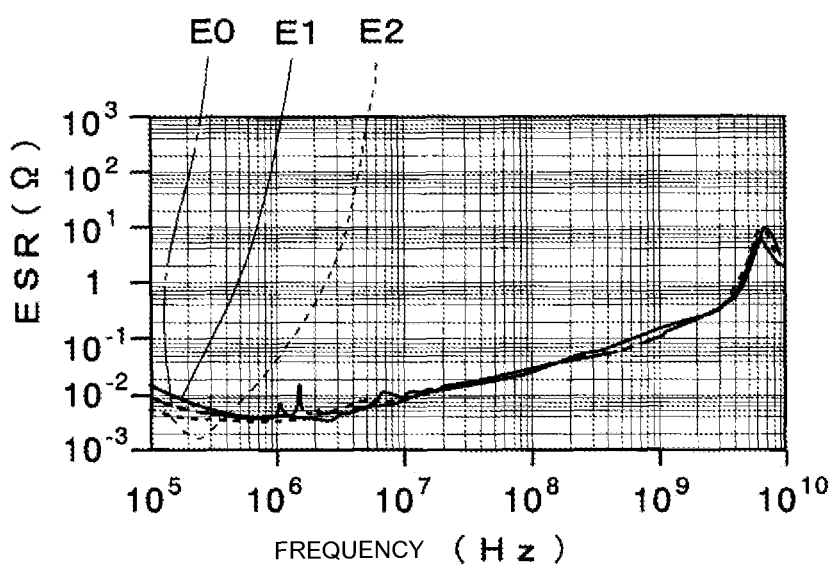

FIGS. 13(a) and 13(b) are diagrams illustrating measurement results where a DC bias voltage of 1.2 V is superimposed. FIGS. 14(a) and 14(b) are diagrams illustrating measurement results where a DC bias voltage of 3.15 V is superimposed. FIGS. 15(a) and 15(b) are diagrams illustrating measurement results where a DC bias voltage of 6.3 V is superimposed.

First, the measurement is performed with a superimposed DC bias voltage of 1.2 V on the AC voltage. As illustrated in FIG. 13(a), all the impedance curve Z0 of the actual product, the impedance curve Z2 of the equivalent circuit model 200, and the impedance curve Z1 of the equivalent circuit model 100 substantially coincide with each other.

When the measurement is performed with a superimposed DC bias voltage of 3.15 V on the AC voltage, as illustrated in FIG. 14(a), the impedance curve Z0 of the actual product and the impedance curve Z2 of the equivalent circuit model 200 do not coincide with each other. However, the impedance curve Z1 of the equivalent circuit model 100 and the impedance curve Z0 of the actual product substantially coincide with each other.

With regard to the ESR characteristic, as illustrated in FIG. 13(b) and FIG. 14(b), both the ESR curve E1 of the equivalent circuit model 100 and the ESR curve E2 of the equivalent circuit model 200 deviate from the ESR curve E0 of the actual product in a low frequency region.

When the measurement is performed with a superimposed DC bias voltage of 6.3 V that is a rated voltage of the actual product on the AC voltage, as illustrated in FIG. 15(a), the impedance curve Z2 of the equivalent circuit model 200 largely deviates from the impedance curve Z0 of the actual product. However, the impedance curve Z1 of the equivalent circuit model 100 and the impedance curve Z0 of the actual product substantially coincide with each other.

In other words, it is confirmed that the frequency characteristic of the equivalent circuit model 100 coincides with that of the actual product with high accuracy even when the DC bias voltage increases up to 6.3 V that is the rated voltage whereas the accuracy of the equivalent circuit model 200 decreases as the DC bias voltage increases.

With regard to the ESR characteristic, as illustrated in FIG. 15(b), both the ESR curve E1 of the equivalent circuit model 100 and the ESR curve E2 of the equivalent circuit model 200 largely deviate from the ESR curve E0 of the actual product in a low frequency region.

The remaining configuration, functions, and effects are similar to those of the foregoing first example, and thus descriptions thereof are not repeated here.

Next, the third example of the present disclosure is described.

This example differs from the foregoing second example in that the configuration of the SPICE model M12 in the SPICE model M1 is altered.

As illustrated in FIG. 15(a), the frequency characteristic of the equivalent circuit model 100 derived in the foregoing second example coincides with that of the actual product with high accuracy even when the applied DC bias voltage is increased up to 6.3 V that is the rated voltage.

However, with regard to the ESR characteristic, the ESR curve E1 of the equivalent circuit model 100 largely deviates from the ESR curve E0 of the actual product in a low frequency region of about 100 KHz, as illustrated in FIG. 15(b).

Thus, in the present example, an equivalent circuit model, ESR of which coincides with that of the actual product even at a higher DC bias voltage, is illustrated by an example.

Figure 16:
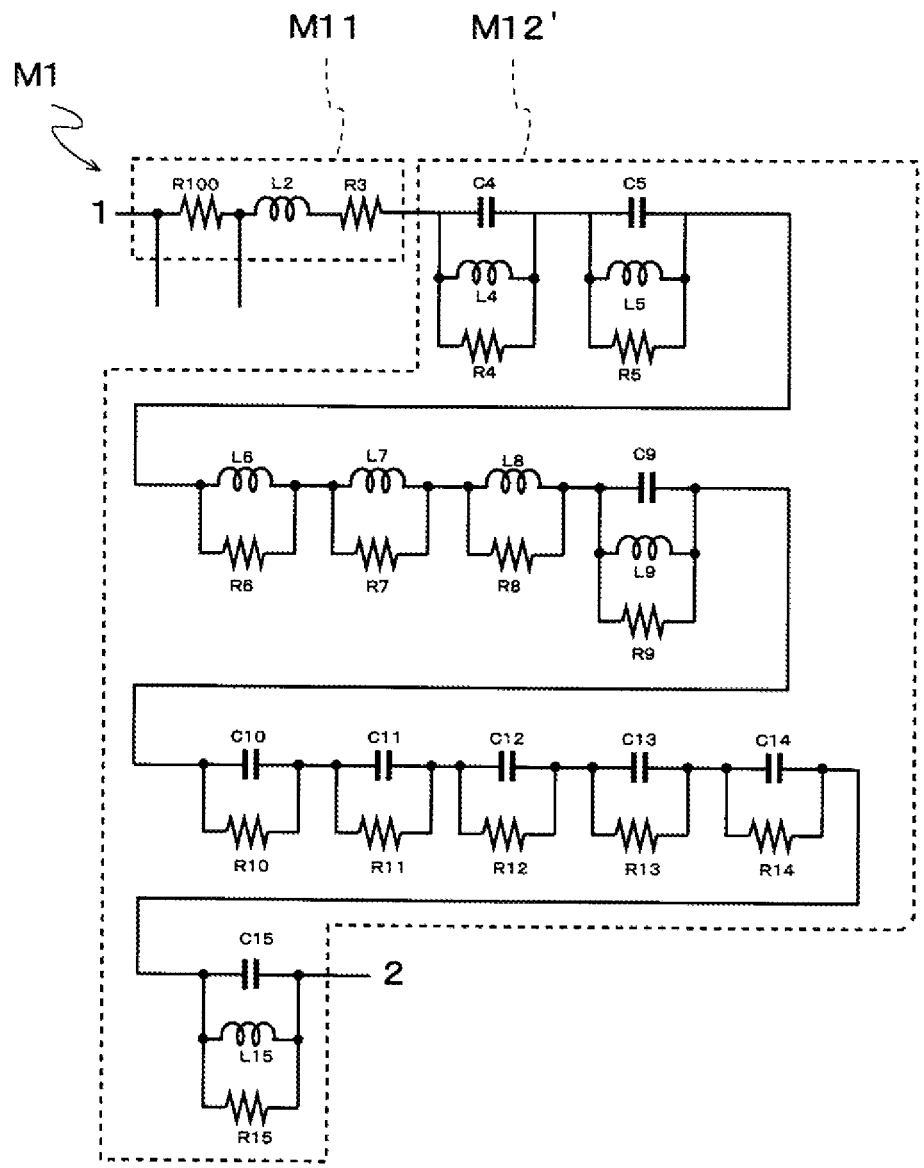
FIG. 16 is a SPICE model diagram of a capacitor equivalent circuit to be applied to an equivalent circuit model according to a third example of the present disclosure.

FIG. 16 is a SPICE model diagram of a capacitor equivalent circuit to be applied to the equivalent circuit model according to the third example of the present disclosure.

As illustrated in FIG. 16, in the present example, the configuration of R, C, and L in the SPICE model M11 that serves as the base circuit in the SPICE model M1 is not changed, and only values of the respective elements are changed. On the other hand, in a SPICE model M12' that is the multistage circuit part, both the configuration of R, C, and L and the values of respective elements are considerably changed from the SPICE model M12 of the second example in an attempt to improve the ESR characteristic.

More specifically, the SPICE model M12' is configured in such a way that four stages of a parallel RCL circuit, three stages of a parallel RL circuit, and five stages of a parallel RC circuit are connected in series to the SPICE model M11.

Here, functions of resistances R100, R3, R4, R5, R6, R7, R8, R9, R10, R11, R12, R13, R14 and R15 are set to 2 meg($\Omega$), 1.83e-03($\Omega$), 0.81e-03($\Omega$), 0.40e-03($\Omega$), 0.95e-02($\Omega$), 2.05e-02($\Omega$), 1.37e-01($\Omega$), 5.24e+00($\Omega$), 1.47e+01($\Omega$), 1.70e+00($\Omega$), 6.42e-02($\Omega$), 6.66e-03($\Omega$), 9.17e-04($\Omega$), 3.00e+01($\Omega$), 2.00e+6($\Omega$), respectively. Functions of the capacitors C45, C5, C9, C10, C11, C12, C13, C14, and C15 are set to 5.34e-05(F), 3.05e-05(F), 1.92e-11(F), 1.40e-4(F), 1.37e-4(F), 2.85e-4(F), 2.70e-4(F), 1.95e-4(F), and 5.31e-12(F), respectively. Functions of the inductors L2, L4, L5, L6, L7, L8, L9, and L15 are set to 1.85e-10(H), 2.27e-11(H), 1.85e-11(H), 2.52e-10(H), 4.37e-11(H), 2.51e-11(H), 4.07e-11(H), and 4.77e-11(H), respectively.

Figure 17:
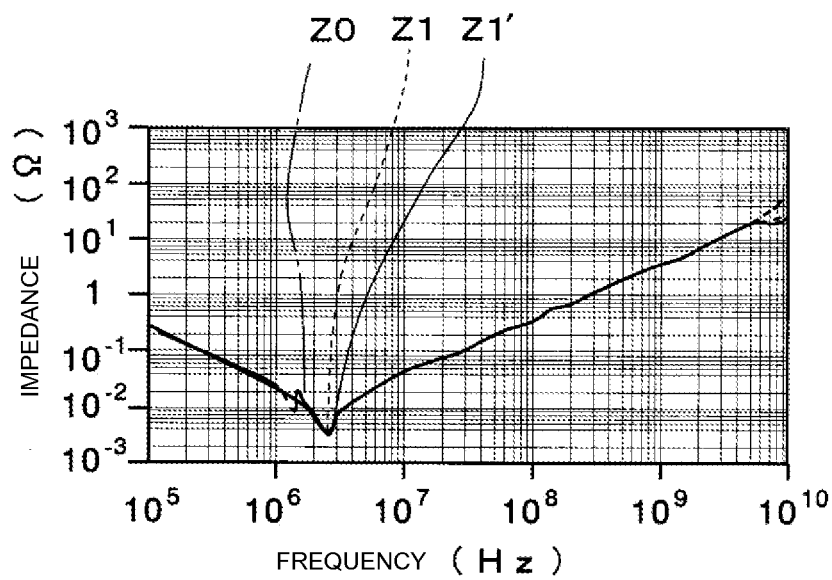
FIGS. 17(a) and 17(b) are diagrams illustrating measurement results in a case where the SPICE model illustrated in FIG. 16 is employed.
Figure 17:
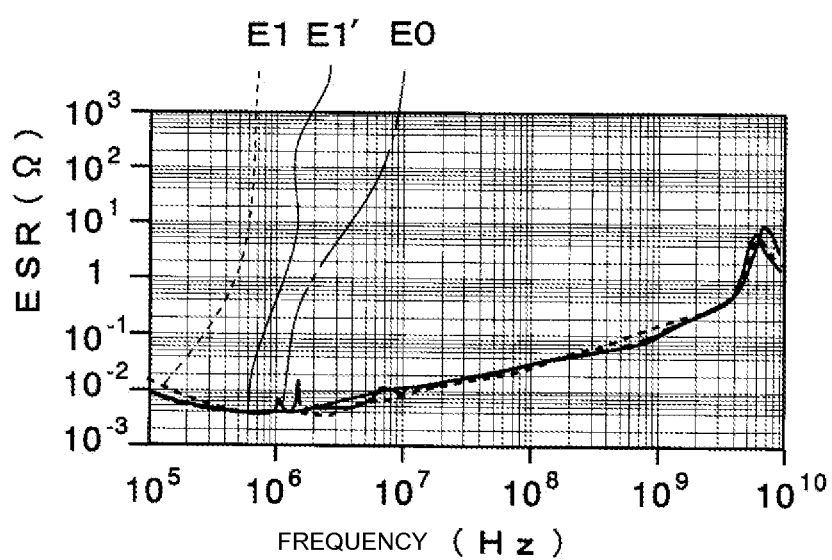

FIGS. 17(a) and 17(b) are diagrams illustrating measurement results when the SPICE M1 model illustrated in FIG. 16 is employed.

A DC bias voltage of 6.3 V is superimposed on an AC voltage with a frequency of 100 KHz to 8.5 GHz, and a resultant voltage is applied to the actual product. Then, the impedance and ESR of the actual product, to which the resultant voltage is applied, are measured. Furthermore, simulations are performed by applying that resultant voltage to the equivalent circuit model 100 of the foregoing second example and an equivalent circuit model (hereinafter, referred to as "equivalent circuit model 100'") of the present example that includes the foregoing SPICE model M12' to obtain the impedance and ESR of each equivalent circuit model.

The results are as follows. As illustrated in FIG. 17(a), the impedance curve Z0 of the actual product, the impedance curve Z1 of the equivalent circuit model 100, and an impedance curve Z1' of the equivalent circuit model 100' substantially coincide with each other. In other words, the frequency characteristics of the equivalent circuit models 100, 100' coincide with that of the actual product with high accuracy even when the applied DC bias voltage increases up to 6.3 V that is the rated voltage.

With regard to the ESR characteristic, as illustrated in FIG. 17(b), the ESR curve E1 of the equivalent circuit model 100 deviates from the ESR curve E0 of the actual product in the low frequency region whereas an ESR curve E1' of the equivalent circuit model 100' of the present example substantially coincides with the ESR curve E0 of the actual product even in the low frequency region.

As described above, the use of the equivalent circuit model 100' of the present example allows the equivalent circuit model 100' to accurately coincide with the actual product in a wide range of frequency not only in the impedance but also in ESR, regardless of change in DC bias voltage.

The remaining configuration, functions, and effects are similar to those of the foregoing second example, and thus descriptions thereof are not repeated here.

As described in the foregoing first example, the equivalent circuit model of the present disclosure may be implemented by including at least the capacitor equivalent circuit section S1 to the current source current generator section S4, and as specific examples thereof, exemplary equivalent circuit models for SPICE that serves as a circuit simulator are described in the foregoing second example and third example.

However, the models for a capacitor that changes the electrostatic capacitance in response to the DC bias voltage are not limited to the equivalent circuit models of the foregoing second and third examples. Even for the same capacitor, different circuit configurations may be required for the equivalent circuit model depending on their use since the accuracy required for the equivalent circuit model varies depending on usage.

FIG. 18(a) to FIG. 20(f) illustrate examples of applicable equivalent circuit models depending on usage.

Figure 18:
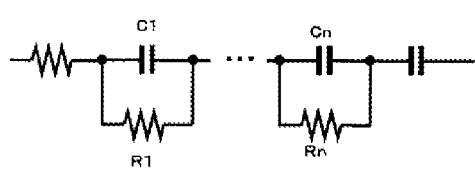
FIGS. 18(a) to 18(f) are illustrations of circuit diagrams representing a first reference example.
Figure 18:
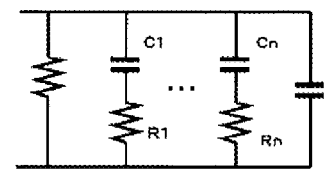
Figure 18:
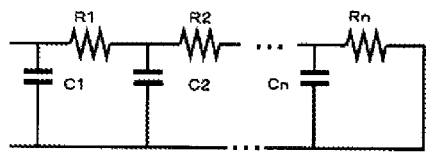
Figure 18:
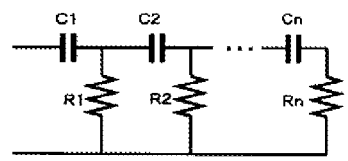
Figure 18:
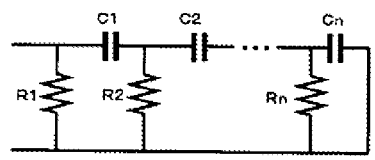
Figure 18:
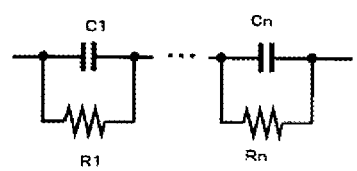
Figure 19:
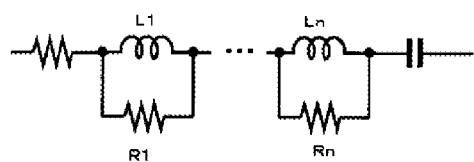
FIGS. 19(a) to 19(f) are illustrations of circuit diagrams representing a second reference example.
Figure 19:
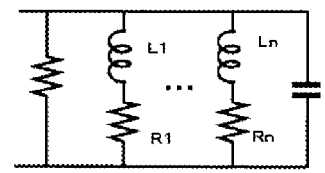
Figure 19:
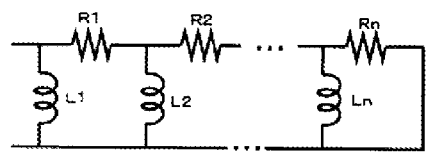
Figure 19:
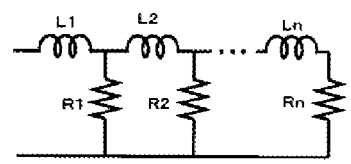
Figure 19:
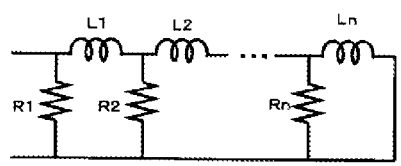
Figure 19:
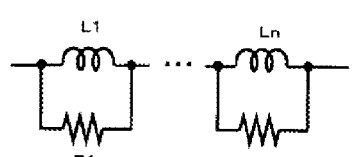
Figure 20:
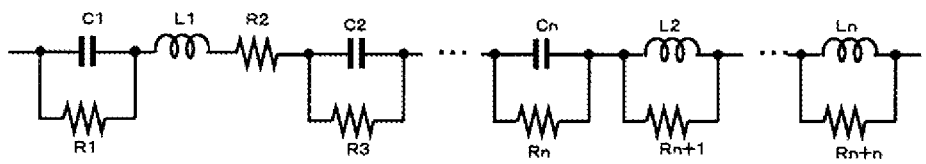
FIGS. 20(a) to 20(f) are illustrations of circuit diagrams representing a third reference example.
Figure 20:
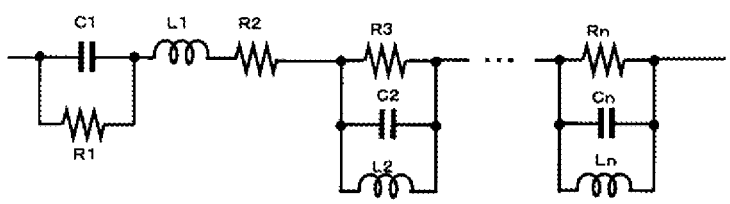
Figure 20:
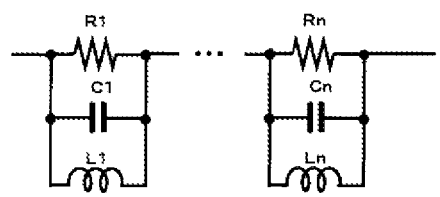
Figure 20:
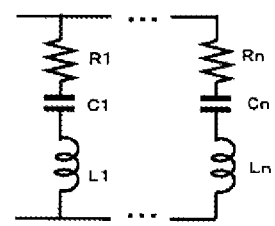
Figure 20:
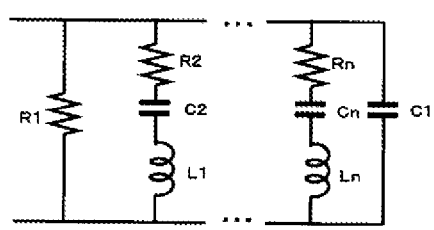
Figure 20:
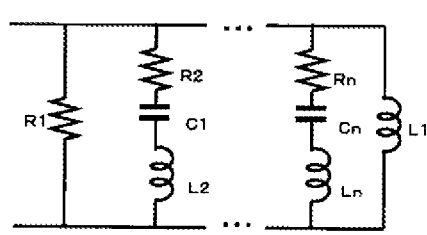

In the examples of equivalent circuit models illustrated in FIG. 18 and FIG. 19, the element to be replaced with a current source is a capacitor element "C1".

When a model is constructed with a two-element RC circuit, models illustrated in FIG. 18(a) to FIG. 18(f) may be conceivable, for example. When a model is constructed with an RL circuit and a C1 element that is not illustrated in the drawing, models illustrated in FIG. 19(a) to FIG. 19(f) may be conceivable.

Furthermore, when a model is constructed with three elements, R, C, and L, models illustrated in FIG. 20(a) to FIG. 20(f) may be conceivable.

By referring to these models, equivalent circuit models corresponding to various usages may be constructed.

It is to be understood that the present disclosure is not limited to the foregoing examples, and that various modifications and changes may be made within the spirit and scope of the present disclosure.

For example, in the foregoing examples, the exemplary equivalent circuit models of multilayer ceramic capacitor are described. However, the present disclosure is not limited to the multilayer ceramic capacitor, and may be applicable to any capacitor that changes the electrostatic capacitance in response to the DC bias voltage.

In embodiments according to the present disclosure, when a superimposed voltage of the AC voltage and the DC bias voltage is applied to the capacitor equivalent circuit section, such a configuration allows the reference current generator section to refer to the AC voltage and calculate the reference current based on the equation (1). Furthermore, the multiplying factor generator section refers to the DC bias voltage and calculates the multiplying factor including the DC bias voltage as a variable, based on the equation (2). Still furthermore, the current source current generator section refers to the reference current and the multiplying factor, and calculates the current to be generated in the current source based on the equation (3).

Here, the nth-degree polynomial of V2 representing the multiplying factor is an equation derived from the correlation relationship between the DC bias voltage and the actual measurement value of electrostatic capacitance for a capacitor to be modeled. Thus, the current generated in the current source current generator section is a current corresponding to the DC bias characteristic of an actual capacitor to be modeled. This current flows through the current source of the base circuit in the capacitor equivalent circuit section. Thus, by causing the current to follow the change in electrostatic capacitance of capacitor, the equivalent circuit model may be able to exhibit the DC bias characteristic close to that of the actual measurement.

According to a method disclosed herein, by applying the method to a simulator, the simulator may be able to perform frequency characteristic analysis close to actual measurement.

As described in detail above, according to the present disclosure, there is provided an equivalent circuit model in which the electrostatic capacitance changes in response to the DC bias voltage. As a result, the present invention has an excellent effect that highly accurate simulations comparable to actual measurements may be performed with the equivalent circuit models of the present invention.

The invention claimed is:

1. A system for simulating electrical properties of an electronic circuit, comprising:
a processor; and memory communicatively coupled to the processor, wherein the processor is configured to:
(1) load an equivalent circuit model of the circuit into the memory,
(2) simulate, by the processor, the equivalent circuit model after the equivalent circuit model is loaded in the memory, and
(3) determine, by the processor, at least one value of an RC circuit, RL circuit, RCL circuit and/or a current source of the equivalent circuit model in order to produce an improved capacitor model;
wherein the equivalent circuit model includes:
a capacitor equivalent circuit section including a base circuit that is either an RC circuit or an RCL circuit and a multistage circuit formed by connecting multiple stages of a circuit to the base circuit, the circuit of the multistage circuit being an RC circuit, an RL circuit, or an RCL circuit, a capacitor element of the base circuit being replaced with a current source;
a reference current generator section that calculates a reference current to be generated when an AC voltage to be applied to the capacitor equivalent circuit section is applied to a capacitor with a unit capacitance, based on a following equation (1), $$I1 = Cref \times (d/dt) \times V1 \qquad (1)$$

where I1 is the reference current, Cref is an ideal capacitor with a unit capacitance, d/dt is a differential operator, and V1 is the AC voltage to be applied to the capacitor equivalent circuit section;
a multiplying factor generator section that calculates a multiplying factor including as a variable a DC bias voltage to be applied to the capacitor equivalent circuit section based on a following equation (2), $$I2 = (a0 + a1 \times V2 + a2 \times V2^2 + a3 \times V2^3 + \ldots + an \times V2^n) \qquad (2)$$

where I2 is the multiplying factor, V2 is the DC bias voltage to be applied to the capacitor equivalent circuit section, and "$a0+a1 \times V2+a2 \times V2^2+a3 \times V2^3+\ldots+an \times V2^n$" is a nth-degree polynomial derived from correlation between a measured electrostatic capacitance and the DC bias voltage; and
a current source current generator section that calculates a current to be generated in the current source based on a following equation (3), $$I = I2 \times I1 \qquad (3)$$

where I is the current to be generated in the current source.

2. A method, implemented by a processor, for simulating electrical properties of an electronic circuit using an equivalent circuit model of the circuit, the method comprising:
configuring a capacitor equivalent circuit section including a base circuit that is either an RC circuit or an RCL circuit and a multistage circuit formed by connecting multiple stages of a circuit to the base circuit, the circuit of the multistage circuit being an RC circuit, an RL circuit, or an RCL circuit, a capacitor element of the base circuit being replaced with a current source;
enabling a reference current generator section to function, said reference current generator section calculating a reference current to be generated when an AC voltage to be applied to the capacitor equivalent circuit section is applied to a capacitor with a unit capacitance, based on a following equation (1), $$I1 = Cref \times (d/dt) \times V1 \qquad (1)$$

where I1 is the reference current, Cref is an ideal capacitor with a unit capacitance, d/dt is a differential operator, and V1 is the AC voltage to be applied to the capacitor equivalent circuit section;
enabling the multiplying factor generator section to function, said multiplying factor generator section calculating a multiplying factor including as a variable a DC bias voltage to be applied to the capacitor equivalent circuit section based on a following equation (2), $$I2 = (a0 + a1 \times V2 + a2 \times V2^2 + a3 \times V2^3 + \ldots + an \times V2^n) \qquad (2)$$

where I2 is the multiplying factor, V2 is the DC bias voltage to be applied to the capacitor equivalent circuit section, and "$a0+a1 \times V2+a2 \times V2^2+a3 \times V2^3+\ldots+an \times V2^n$" is a nth-degree polynomial derived from correlation between a measured electrostatic capacitance and the DC bias voltage; and enabling the current source current generator section to function, said current source current generator section calculating a current to be generated in the current source based on a following equation (3), $$I = I2 \times I1 \tag{3}$$

here I is the current to be generated in the current source.

3. A non-transitory computer-readable medium storing a program including instructions, which when executed by a processor, implement a method for simulating electrical properties of an electronic circuit using an equivalent circuit model of the circuit, the method comprising:

configuring a capacitor equivalent circuit section including a base circuit that is either an RC circuit or an RCL circuit and a multistage circuit formed by connecting multiple stages of a circuit to the base circuit, the circuit of the multistage circuit being an RC circuit, an RL circuit, or an RCL circuit, a capacitor element of the base circuit being replaced with a current source;

enabling a reference current generator section to function, said reference current generator section calculating a reference current to be generated when an AC voltage to be applied to the capacitor equivalent circuit section is applied to a capacitor with a unit capacitance, based on a following equation (1), $$I1 = Cref \times (d/dt) \times V1 \tag{1}$$

where I1 is the reference current, Cref is an ideal capacitor with a unit capacitance, d/dt is a differential operator, and V1 is the AC voltage to be applied to the capacitor equivalent circuit section;

enabling the multiplying factor generator section to function, said multiplying factor generator section calculating a multiplying factor including as a variable a DC bias voltage to be applied to the capacitor equivalent circuit section based on a following equation (2), $$I2 = (a0 \times a1 \times V2 + a2 \times V2^2 + a3 \times V2^3 + \ldots + an \times V2^n) \tag{2}$$

where I2 is the multiplying factor, V2 is the DC bias voltage to be applied to the capacitor equivalent circuit section, and "$a0 + a1 \times V2 + a2 \times V2^2 + a3 \times V2^3 + \ldots + an \times V2^n$" is a nth-degree polynomial derived from correlation between a measured electrostatic capacitance and the DC bias voltage; and enabling the current source current generator section to function, said current source current generator section calculating a current to be generated in the current source based on a following equation (3), $$I = I2 \times I1 \tag{3}$$

where I is the current to be generated in the current source.

* * * * *